(12) United States Patent
Tomioka

(10) Patent No.: US 6,900,990 B2
(45) Date of Patent: May 31, 2005

(54) ELECTRONIC APPARATUS PROVIDED WITH LIQUID COOLING TYPE COOLING UNIT COOLING HEAT GENERATING COMPONENT

(75) Inventor: Kentaro Tomioka, Sayama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/641,105

(22) Filed: Aug. 15, 2003

(65) Prior Publication Data

US 2004/0042184 A1 Mar. 4, 2004

(30) Foreign Application Priority Data

Aug. 27, 2002 (JP) ........................................ 2002-247563

(51) Int. Cl.[7] .............................................. H05K 5/06
(52) U.S. Cl. ...................... 361/752; 361/687; 361/710; 361/700; 174/15.1; 174/15.2
(58) Field of Search ................................ 361/752, 687, 361/695, 700, 710, 104.33, 185, 699; 174/15.1, 15.2; 165/80.1, 80.4; 257/719, 726

(56) References Cited

U.S. PATENT DOCUMENTS 6,029,742 A * 2/2000 Burward-Hoy ............ 165/80.4
6,166,907 A * 12/2000 Chien ........................ 361/699
6,567,269 B2 * 5/2003 Homer et al. ............... 361/700
6,697,253 B2 * 2/2004 Minamitani et al. ........ 361/687

FOREIGN PATENT DOCUMENTS

| JP | 142886 | 6/1995 |
| JP | 7-142886 | 6/1995 |
| JP | 2000-277963 | 10/2000 |

* cited by examiner

Primary Examiner—Kamand Cuneo
Assistant Examiner—Hung S. Bui
(74) Attorney, Agent, or Firm—Finnegan, Henderson, Farabow, Garrett & Dunner, L.L.P.

(57) ABSTRACT

An electronic apparatus includes a housing which accommodates a heat generating component. A heat receiving portion thermally connected to the heat generating component is connected to a heat radiating portion via a circulating path through which a liquid coolant is circulated. The housing accommodates a heat sink which is separate from the heat radiating portion, and a fan. Part of heat from the heat generating component conducted to the heat receiving portion is conducted to the heat sink via a heat transferring member. The fan blows a cooling air against the heat sink.

23 Claims, 7 Drawing Sheets

ELECTRONIC APPARATUS PROVIDED WITH LIQUID COOLING TYPE COOLING UNIT COOLING HEAT GENERATING COMPONENT

CROSS-REFERENCE TO RELATED APPLICATIONS

This application is based upon and claims the benefit of priority from the prior Japanese Patent Application No. 2002-247563, filed Aug. 27, 2002, the entire contents of which are incorporated herein by reference.

BACKGROUND OF THE INVENTION

1. Field of the Invention

The present invention relates to an electronic apparatus provided with a cooling unit that cools circuit components, such as a microprocessor, which generate heat during operation, and more specifically, to the structure of a cooling unit having a circulating path through which a liquid coolant flows and an air-cooled heat sink.

2. Description of the Related Art

A microprocessor is incorporated in, for example, notebook-type portable computers. The heat that the microprocessor generates while operating is increasing as its data-processing speed rises, and it performs more and more functions. The higher the temperature of the microprocessor, the less efficiently it operates. To cool the microprocessor, so-called cooling systems of the liquid-cooling type have been developed in recent years. A liquid-cooling system uses a liquid coolant that has a far higher specific heat than air.

Japanese Patent Application KOKAI Publication No. 7-142886 discloses a cooling system of the liquid-cooling type, configured for use in a portable computer. The cooling system comprises a heat-receiving header, a heat-radiating header, and a tube for circulating the liquid coolant. The heat-receiving header is accommodated in a housing of the portable computer and thermally connected to the microprocessor. The heat-radiating header is accommodated in a display unit supported by the housing. The tube is arranged to extend between the housing and the display unit to connect the heat-receiving header and the heat-radiating header together.

With this cooling system, the liquid coolant absorbs heat from the microprocessor in the heat-receiving header. The liquid coolant thus heated is transferred to the heat-radiating header through the tube. While passing through the heat-radiating header, the liquid coolant releases heat from the microprocessor. The liquid coolant cooled by the heat-radiating header returns to the heat-receiving header through the tube. Then, the liquid coolant absorbs heat from the microprocessor again. This circulation of the liquid coolant efficiently transfers heat from the microprocessor to the heat-radiating header. This serves to improve cooling performance for the microprocessor compared to common conventional cooling systems of the air-cooling type.

The heat-radiating header used in the cooling system of the liquid-cooling type has a coolant channel through which the liquid coolant flows. It is also thermally connected to a metal housing of the display unit. With this arrangement, heat from the microprocessor absorbed by the liquid coolant is diffused by heat conductance from the heat-radiating header to the metal housing. The heat is then released to the air from the surface of the metal housing. In other words, an increase in the value of heat conducted from the heat-radiating header to the metal housing, increases the surface temperature of the metal housing and enhances the radiating performance of the heat-radiating header.

An operator touches the metal housing of the display unit when carrying the potable computer or closing and opening the display unit. Thus, the surface temperature of the metal housing must not be thoughtlessly increased. Considering thermal effects on the operator, the surface temperature of the metal housing must be kept equal to or lower than, for example, 60° C.

However, under this thermal condition, the allowable amount of heat released from the heat-radiating header is estimated to be at most between 10 and 20 W. The microprocessor for the portable computer is expected to have its performance further improved in the future. The value of heat generated by the microprocessor is expected to correspondingly increase sharply. Accordingly, the current cooling system of the liquid-cooling type cannot cope with an increase in the amount of heat generated by the microprocessor. Therefore, the cooling performance for the microprocessor may be insufficient.

BRIEF SUMMARY OF THE INVENTION

According to an embodiment of the present invention, an electronic apparatus includes a housing having a heat generating component; a heat receiving portion thermally connected to the heat generating component; a heat radiating portion which releases heat from the heat generating component; a circulating path through which a liquid coolant circulates between the heat receiving portion and the heat radiating portion, the circulating path being used to transfer the heat from the heat generating component conducted to the heat receiving portion, to the heat radiating portion via the liquid coolant; a heat sink which is separate from the heat radiating portion; a heat transferring member which transfers part of the heat from the heat generating component conducted to the heat receiving portion, to the heat sink; and a fan which blows a cooling air against the heat sink.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the embodiments given below, serve to explain the principles of the invention.

DETAILED DESCRIPTION OF THE INVENTION

A first embodiment of the present invention will be described below with reference to FIGS. 1 to 7 in which the first embodiment is applied to a portable computer.

Figure 1:
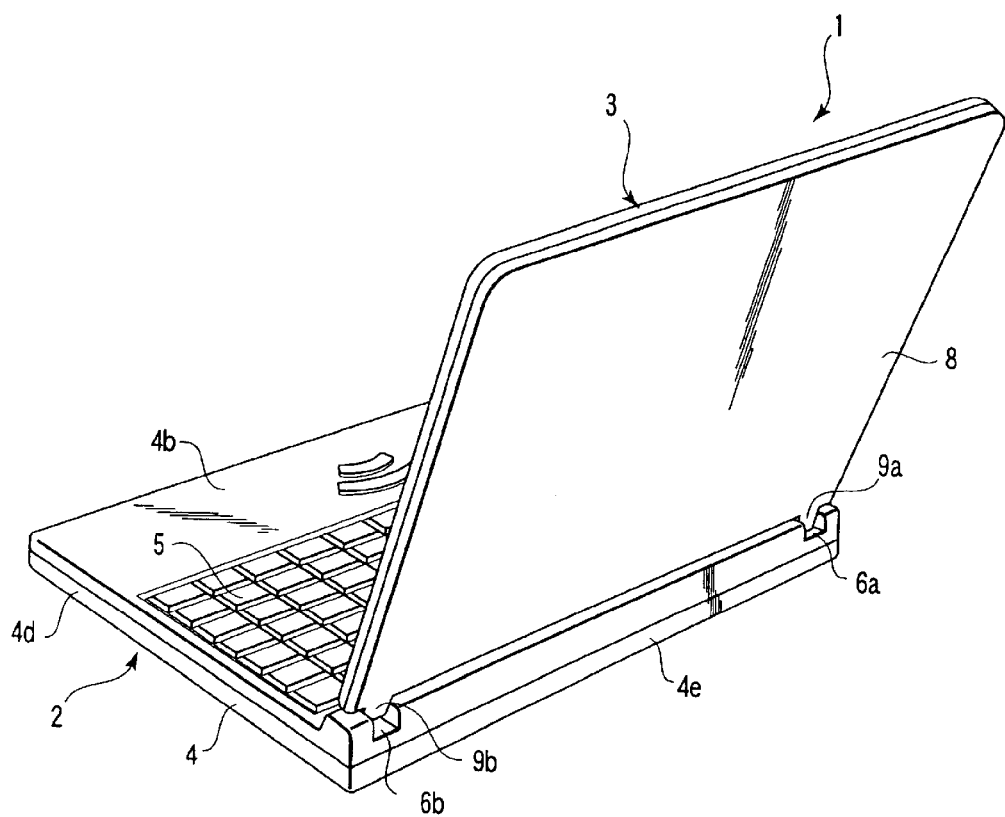
FIG. 1 is a perspective view of a portable computer according to a first embodiment of the present invention.
Figure 2:
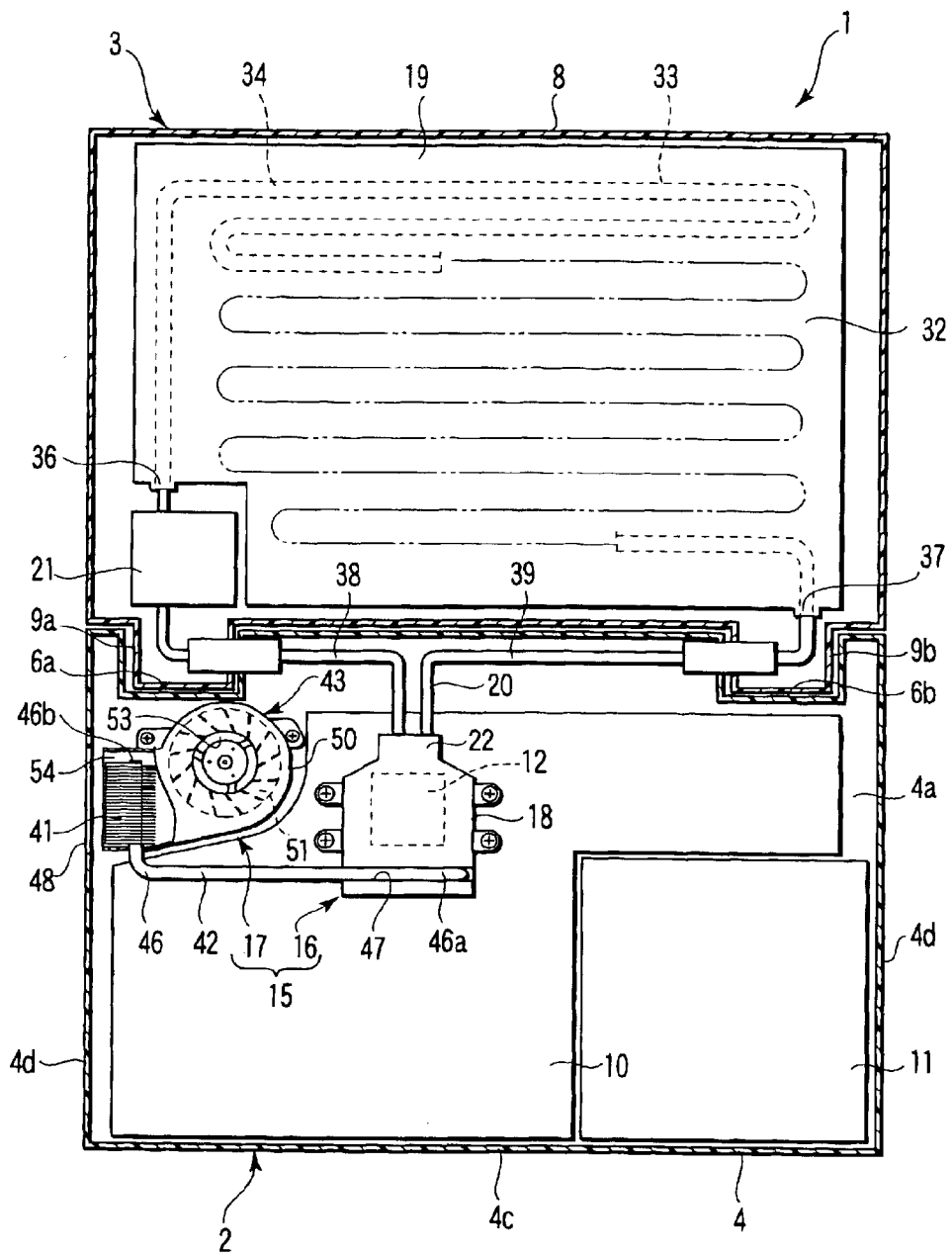
FIG. 2 is a sectional view of the portable computer according to the first embodiment of the present invention, showing the positional relationship between a liquid cooling unit and an air cooling unit.

FIGS. 1 and 2 show a portable computer 1 as an electronic apparatus. The portable computer 1 comprises a computer main unit 2 and a display unit 3. The computer main unit 2 has a first housing 4 shaped like a flat box. The first housing 4 comprises a bottom wall 4a, a top wall 4b, a front wall 4c, right and left side walls 4d, and a rear wall 4e. The top wall 4b supports a keyboard 5. The top wall 4b has a pair of display supporting portions 6a and 6b. The display supporting portions 6a and 6b are located in the rear of the keyboard 5 and spaced from each other in a width direction of the first housing 4.

A display unit 3 comprises a display housing 8 as a second housing. The display housing 8 accommodates a liquid crystal display panel (not shown). The display housing 8 has a pair of hollow legs 9a and 9b protruding from the respective ends of the housing 8. The hollow legs 9a and 9b are inserted into the display supporting portions 6a and 6b, respectively, of the first housing 4. They are supported at the rear end of the housing 4 via hinges (not shown). Thus, the display unit 3 can be rotationally moved between a closed position, in which it is brought down so as to cover the keyboard 5 from above, and an open position in which it is stood up so as to expose the keyboard 5.

As shown in FIG. 2, the housing 4 accommodates a printed circuit board 10 and a CD-ROM drive 11. The printed circuit board 10 and the CD-ROM drive 11 are arranged side by side on the bottom wall 4a of the housing 4 and fixed to the bottom wall 4a.

Figure 4:
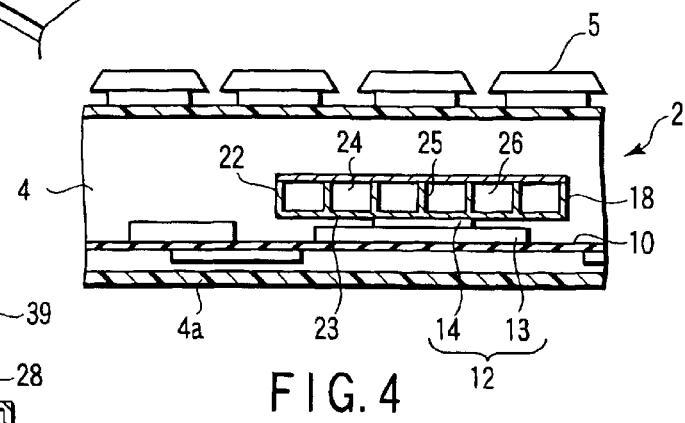
FIG. 4 is a sectional view of the portable computer according to the first embodiment of the present invention, showing the positional relationship between a semiconductor package and the heat receiving portion.

As shown in FIG. 4, a semiconductor package 12 as a heat generating component is soldered to the top surface of the printed circuit board 10. The semiconductor package 12 constitutes a microprocessor acting as the nucleus of the portable computer 1. It is located in the rear of the printed circuit board 10. The semiconductor package 12 has a square base substrate 13 and an IC chip 14 mounted on the center of the base substrate 13. The IC chip 14 generates a large amount of heat during operation owing to its increased processing speed and the increased number of its functions. The IC chip 14 needs to be cooled to keep operating in stable conditions.

As shown in FIG. 2, the portable computer 1 further comprises a cooling unit 15 to cool the semiconductor package 12. The cooling unit 15 comprises a liquid cooling unit 16 and an air cooling unit 17.

Figure 3:
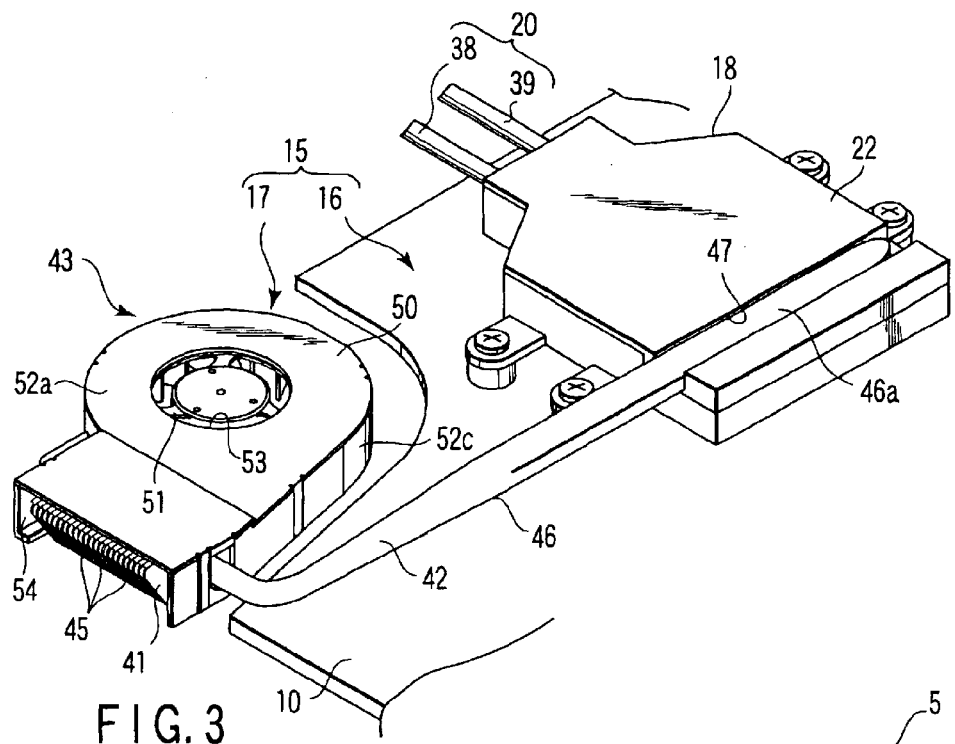
FIG. 3 is a perspective view of a cooling unit according to the first embodiment of the present invention, showing the positional relationship between a heat receiving portion, a heat sink, an electric fan, and a heat pipe.
Figure 5:
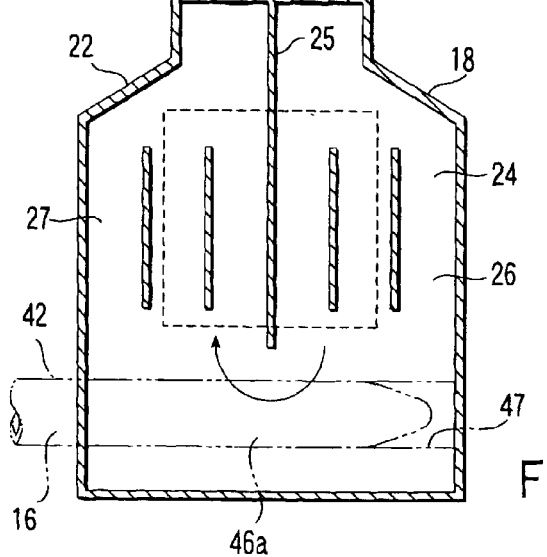
FIG. 5 is a sectional view of the heat receiving portion according to the first embodiment of the present invention.

The liquid cooling unit 16 comprises a heat receiving portion 18, a heat radiating portion 19, a circulating path 20, and a pump 21. The heat receiving portion 18 has a metal case 22 as shown in FIGS. 3 to 5. The case 22 is shaped like a flat box and fixed to the printed circuit board 10, accommodated in the first housing 4. The case 22 is a size larger than the semiconductor package 12. The bottom surface of the case 22 constitutes a flat heat receiving surface 23. The heat receiving surface 23 is thermally connected to the IC chip 14 of the semiconductor package 12 via thermally conductive grease or a thermally conductive sheet (not shown).

A coolant channel 24 is formed inside the case 22. The coolant channel 24 is thermally connected to the IC chip 14 via the heat receiving surface 23. The coolant channel 24 is partitioned into a first channel 26 and a second channel 27 via a panel wall 25. The downstream end of the first channel 26 and the upstream end of the second channel 27 join together inside the case 22.

The case 22 has an inlet port 28 and an outlet port 29 at one end of it. The inlet port 28 connects to the upstream end of the first channel 26. The outlet port 29 connects to the downstream end of the second channel 27. The inlet port 28 and the outlet port 29 are arranged side by side so as to open toward the rear of the first housing 4.

Figure 6:
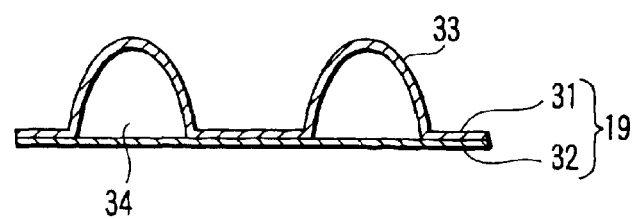
FIG. 6 is a sectional view of a heat radiating portion according to the first embodiment of the present invention.

The heat radiating portion 19 is arranged between the rear surface of the display housing 8 and the liquid crystal display panel. It is also thermally connected to the rear surface of the display housing 8. The heat radiating portion 19 is shaped like a rectangular plate smaller than the rear surface of the display housing 8. As shown in FIG. 6, the heat radiating portion 19 comprises a first radiator plate 31 and a second radiator plate 32. The first and second radiator plates 31 and 32 are each made of metal and are placed on each other.

The first radiator plate 31 has a bulging portion 33 extending away from the second radiator plate 32. The bulging portion 33 meanders substantially all over the surface of the first radiator plate 31. It also opens toward the second radiator plate 32. An opening end of the bulging portion 33 is closed by the second radiator plate 32. Thus, the bulging portion 33 of the first radiator plate 31 constitutes a coolant channel 34 between itself and the second radiator plate 32.

As shown in FIG. 2, the heat radiating portion 19 has an inlet port 36 and an outlet port 37. The inlet port 36 is located at the upstream end of the coolant channel 34. The outlet port 37 is located at the downstream end of the coolant channel 34. The inlet port 36 and the outlet port 37 are spaced from each other in the width direction of the display housing 8.

The circulating path 20 comprises two pipes 38 and 39. The first pipe 38 connects the outlet port 29 of the heat receiving portion 18 and the inlet port 36 of the heat radiating portion 19 together. The first pipe 38 leads from the interior of the housing 4 to the interior of the display housing 8 through the inside of the left leg 9a. The second pipe 39 connects the inlet port 28 of the heat receiving portion 18 and the outlet port 37 of the heat radiating portion 19 together. The second pipe 39 leads from the interior of the housing 4 to the interior of the display housing 8 through the inside of the right leg 9b.

A liquid coolant is filled into the coolant channel 24 of the heat receiving portion 18, the coolant channel 34 of the heat receiving portion 19, and the circulating path 20. The liquid coolant is an antifreeze solution containing, for example, water to which an ethyleneglycol solution and a corrosion inhibitor, if required, are added.

The pump 21 is installed in the middle of the first pipe 38. The pump 21 is used to forcibly circulate the liquid coolant between the heat receiving portion 18 and the heat radiating portion 19. In the present embodiment, the pump 21 is accommodated in the display housing 8. The pump 21 starts to be driven, for example, when the portable computer 1 is powered on or when the temperature of the semiconductor package 12 reaches a predetermined value.

Once the pump 21 starts to be driven, the liquid coolant is delivered to the heat radiating portion 19. The liquid coolant thus flows through the circulating path 20. More specifically, the liquid coolant in the coolant channel 24 of the heat receiving portion 18 absorbs heat from the semiconductor package 12 while flowing from the first channel 26 to the second channel 27. The liquid coolant thus heated is delivered to the heat radiating portion 19 through the first pipe 38. It then flows through the coolant channel 34. While the liquid coolant is flowing through the channel 34, the heat absorbed by the liquid coolant is diffused to the first and second radiator plates 31 and 32. At the same time, the heat is conducted from the first and second radiator plates 31 and 32 to the display housing 8. The heat is then released from the outer surface of the display housing 8 by natural air cooling.

The liquid coolant is cooled by heat exchange in the heat radiating portion 19. It then returns to the coolant channel 24 of the heat receiving portion 18 via the second pipe 39. The liquid coolant absorbs heat from the semiconductor package 12 again while flowing through the coolant channel 24. It is then delivered to the heat radiating portion 19. The repetition of such a cycle allows heat from the semiconductor package 12 to be sequentially transferred to the heat radiating portion 19. The heat is released to the exterior of the portable computer 1 from the outer surface of the display housing 8.

Figure 7:
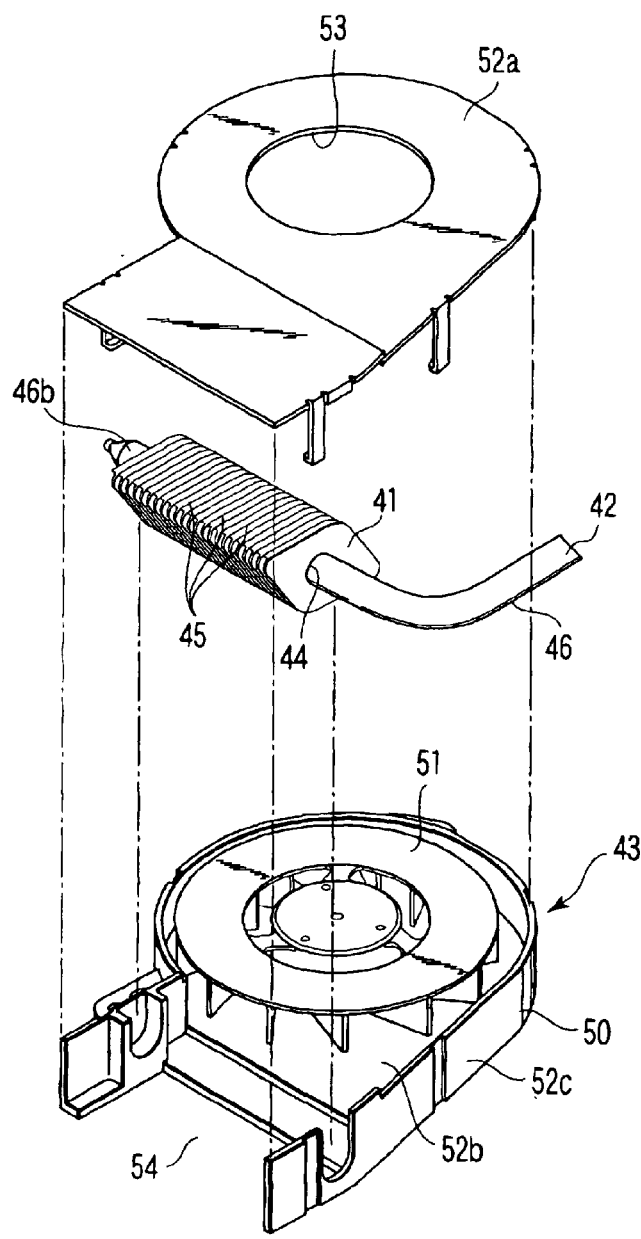
FIG. 7 is a perspective view showing the positional relationship between the electric fan and the heat sink according to the first embodiment of the present invention.

As shown in FIGS. 2, 3, and 7, the air cooling unit 17 of the cooling unit 15 comprises a heat sink 41, a heat pipe 42 as a heat transferring member, and an electric fan 43.

The heat sink 41 is formed of a metal material, such as an aluminum alloy, which has a high thermal conductivity. The heat sink 41 has a through-hole 44 in its center and a plurality of radiating fins 45 on its outer peripheral surface. The heat sink 41 extends along the left side wall 4d of the first housing 4.

The heat pipe 42 is used to transfer part of the heat from the semiconductor package 12 conducted to the heat receiving portion 18, to the heat sink 41. The heat pipe 42 comprises a metal outer pipe 46 filled with a coolant. The outer pipe 46 has a first end 46a and a second end 46b. It is also bent so that the first end 46a and the second end 46b are crossed at right angles.

The first end 46a of the outer pipe 46 is fitted into a fitting groove 47 formed in the upper surface of case 22 of the heat receiving portion 18. The fitting groove 47 is located in an area corresponding to the junction between the first channel 26 and second channel 27 of the coolant channel 24. The second end 46b of the outer pipe 46 is fitted into the through-hole 44 in the heat sink 41. Thus, the heat pipe 42 is thermally connected both to the heat receiving portion 18 and to the heat sink 41.

As shown in FIG. 2, the first end 46a of the heat pipe 42 extends in the width direction of the first housing 4. The second end 46b of the heat pipe 42 correspondingly extends along the left side wall 4d of the first housing 4. The heat sink 41, thermally connected to the second end 46b, lies opposite a vent 48 opened in the side wall 4d.

As shown in FIGS. 2 and 3, the electric fan 43 is arranged between the heat receiving portion 18 and the heat sink 41. In other words, the electric fan 43, the heat receiving portion 18, and the heat sink 41 are arranged inside the first housing 4 in its width direction.

The electric fan 43 comprises a metal fan casing 50 and a centrifugal impeller 51. The fan casing 50 is shaped like a flat box having an upper wall 52a, a lower wall 52b, and a peripheral wall 52c. The fan casing 50 is fixed to the bottom wall 4a of the first housing 4.

Suction ports 53 (only one of them is shown) are formed in the center of the upper wall 52a and lower wall 52b, respectively. The peripheral wall 52c of the fan casing 50 connects the outer peripheral edge of the upper wall 52a and the outer peripheral edge of the lower wall 52b together. An ejection port 54 is formed in the peripheral wall 52c. The ejection port 54 has such a size as corresponds to the heat sink 41. It protrudes from the fan casing 50 toward the vent 48 in the first housing 4. The heat sink 41 is arranged at the ejection port 54 of the fan casing 50.

The impeller 51 is accommodated in the fan casing 50. The impeller 51 is driven by a motor (not shown) when the temperature of the semiconductor package 12 exceeds the predetermined value.

Once the impeller 51 starts to rotate, the air inside the first housing 4 is sucked into the rotational center of the impeller 51 through the suction port 53. The sucked air is ejected into the fan casing 50 from the outer periphery of the impeller 51. It then becomes a cooling air and is guided to the ejection port 54. The cooling air is blown against the heat sink 41, located at the ejection port 54.

Part of the heat from the semiconductor package 12 is transferred from the heat receiving portion 18 to the first end 46a of the heat pipe 42. Thus, the coolant in the outer pipe 46 is heated to become vapor. The vapor flow from the first end 46a to the second end 46b. The vapor transmitted to the second end 46b release heat and is thus concentrated. The heat released by this concentration is further released by thermal conduction from the second end 46b to the heat sink 41.

The coolant is liquefied at the second end 46b of the heat pipe 42. It then returns to the first end 46a by capillary force. The returned coolant absorbs heat from the semiconductor package 12 again. It is thus heated to become vapor. This repetition of evaporation and concentration allows part of the heat from the semiconductor package 12 to be transferred to the heat sink 41.

When the temperature of the semiconductor package 12 exceeds the predetermined value, the impeller 51 of the electric fan 43 starts to rotate. The rotation of the impeller 51 causes a cooling air to be blown against the heat sink 41, located at the ejection port 54 in the fan casing 50. The cooling air passes through the radiating fins 45 of the heat sink 41. While flowing through the fins 45, the air forcibly cools the heat sink 41. The heat from the semiconductor package 12 transferred to the heat sink 41 is carried away by the heat exchange between the heat sink 41 and the cooling air. The cooling air heated by this heat exchange is discharged from the vent 48 to the exterior of the portable computer 1.

With the above arrangements, the heat from the semiconductor package 12 is absorbed by the liquid coolant in the heat receiving portion 18 and then transferred to the heat radiating portion 19. The heat is then released from the heat radiating portion 19. At the same time, part of the heat from the semiconductor package 12 conducted to the heat receiving portion 18 is transferred to the heat sink 41, which is separate from the heat radiating portion 19, through the heat pipe 42. This part is then released from the heat sink 41. It is thus possible to use both liquid cooling with the liquid coolant flowing through the circulating path 20 and forced air cooling with the heat sink 41 and the electric fan 43. Consequently, cooling performance for the semiconductor package 12 can be enhanced. This makes it possible to adequately deal with an increase in the value of heat produced by the semiconductor package 12.

The heat from the semiconductor package 12 is released not only from the heat radiating portion 19 in the display housing 8 but also from the heat sink 41 in the first housing 4. Thus, even if the radiating performance for the semiconductor package 12 is set at a value between 10 and 20 W so that, for example, the temperature of surface of the display housing 8 will not exceed 60° C., the cooling performance for the semiconductor package 12 can be supplemented by the forced air cooling carried out by the air cooling unit 17. As a result, it is possible to suppress an increase in the surface of the display housing 8, thermally connected to the heat radiating portion 19, while maintaining the cooling performance for the semiconductor package 12. This prevents the display housing 8 from becoming too hot for an operator to touch with his or her hand.

Figure 8:
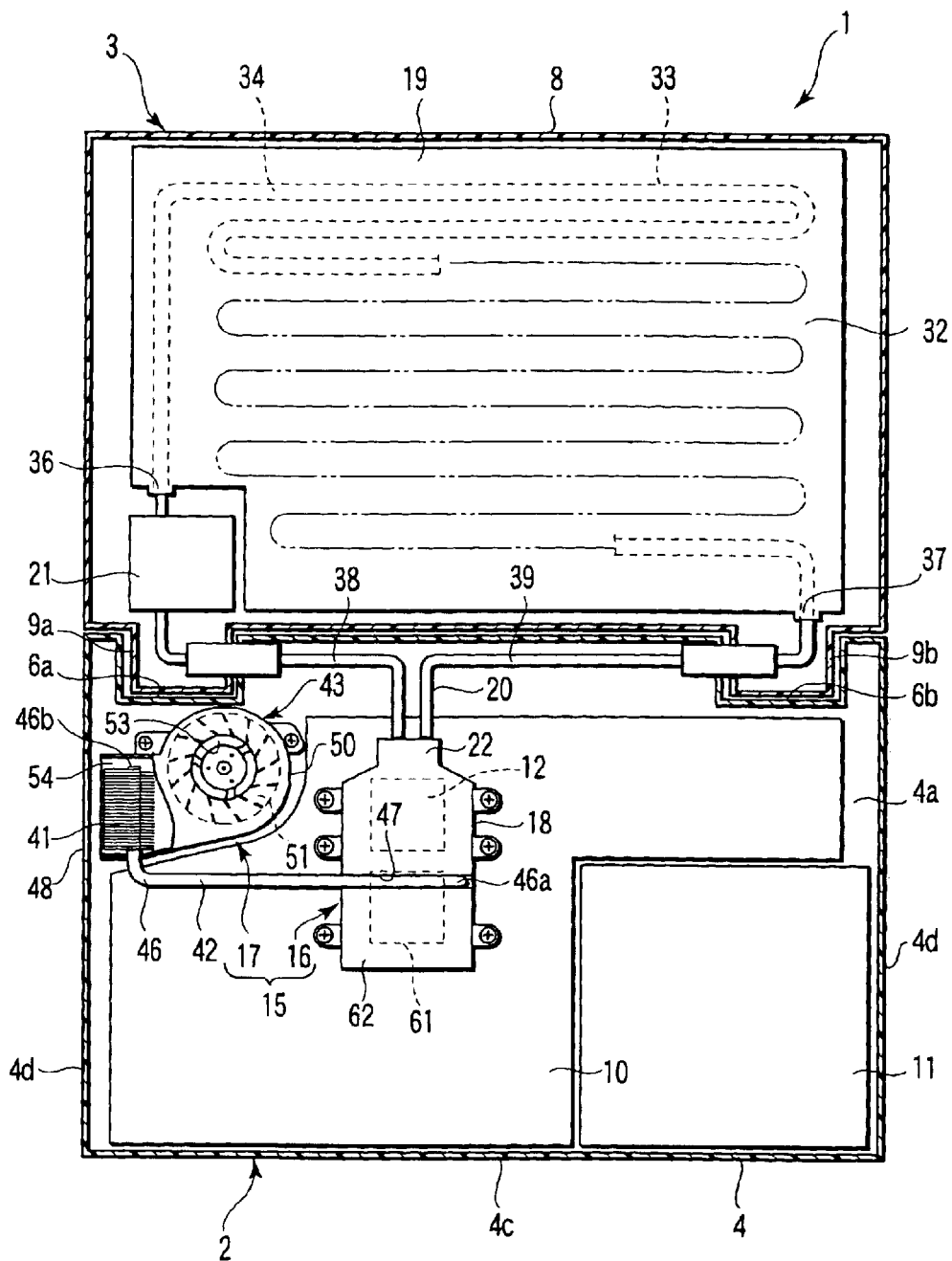
FIG. 8 is a sectional view of a portable computer according to a second embodiment of the present invention, showing the positional relationship between a liquid cooling unit and an air cooling unit.

The present invention is not limited to the above first embodiment. FIG. 8 discloses a second embodiment of the present invention.

In the second embodiment, a chip set 61 is mounted on the printed circuit board 10 as another heat generating component. The chip set 61 is composed of a plurality of IC chips molded integrally and is adjacent to the semiconductor package 12.

The case 22 of the heat receiving portion 18 has an extended portion 62. The extended portion 62 extends over the chip set 61. The bottom surface of the extended portion 62 is thermally connected to the chip set 61. The coolant channel 24 in the heat receiving portion 18 reaches the interior of the extended portion 62. The liquid coolant flowing through the coolant channel 24 absorbs heat from the chip set 61. Furthermore, the first end 46a of the heat pipe 42 is thermally connected to the extended portion 62 of the case 22.

With this arrangement, heat from the semiconductor package 12 and chip set 61 is absorbed by the liquid coolant flowing through the circulating path 20 and is then transferred to the heat radiating portion 19. The heat is then released from the heat radiating portion 19. At the same time, part of the heat from the semiconductor package 12 and chip set 61 conducted to heat receiving portion 18 is transferred to the heat sink 41 through the heat pipe 42. This part is then released from the heat sink 41.

Therefore, the semiconductor package 12 and the chip set 61 can be efficiently cooled using both liquid cooling with the liquid coolant and forced air cooling.

Figure 9:
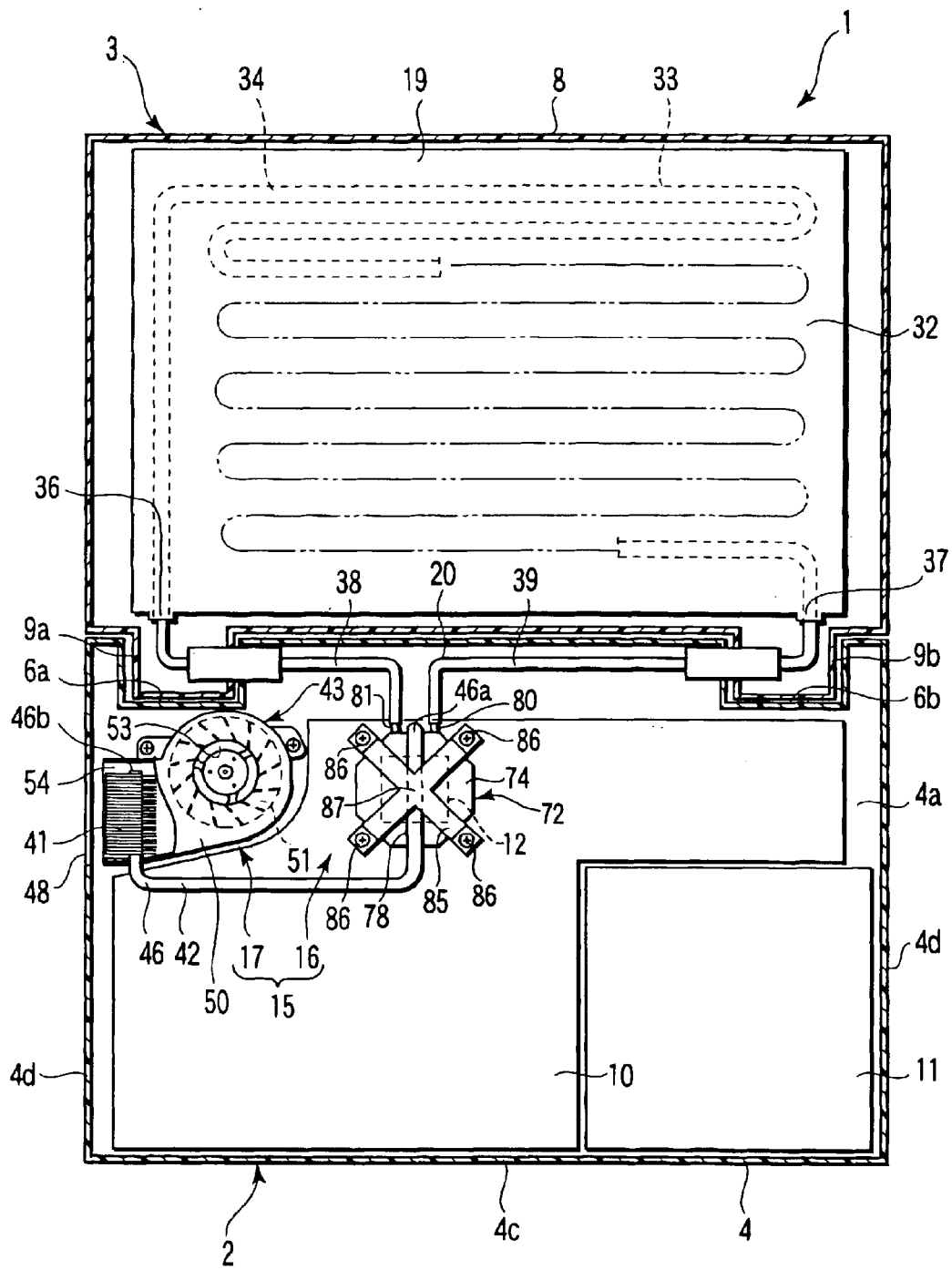
FIG. 9 is a sectional view of a portable computer according to a third embodiment of the present invention, showing the positional relationship between a liquid cooling unit and an air cooling unit.
Figure 10:
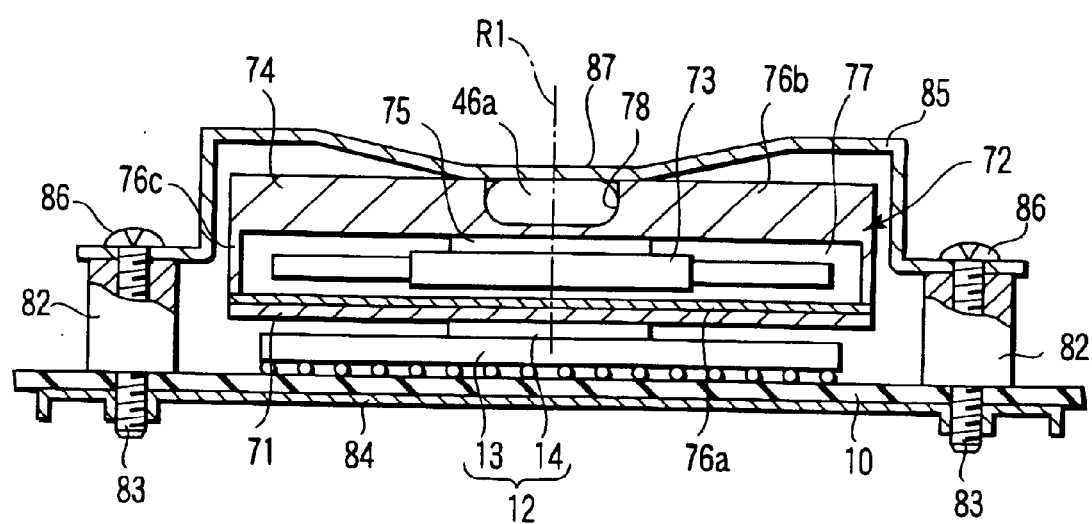
FIG. 10 is a sectional view of the third embodiment of the present invention, showing that a pump integrated with a heat receiving portion is fixed to a printed circuit board.

FIGS. 9 and 10 disclose a third embodiment of the present invention.

The third embodiment differs from the above first embodiment in the arrangement of a portion receiving heat from the semiconductor package 12 and in an arrangement for circulation of a liquid coolant. The basic configuration of the portable computer 1 except for the above arrangements is similar to that in the above first embodiment. Thus, in the third embodiment, the same components as those in the first embodiment will be denoted by the same reference numerals. Their description is omitted.

As shown in FIGS. 9 and 10, the liquid cooling unit 16 of the cooling unit 15 comprises a rotary pump 72 integrated with a heat receiving portion 71. The heat receiving portion 71 is composed of a metal plate larger than the base substrate 13 of the semiconductor package 12. The heat receiving portion 71 covers the IC chip 14 from above. The IC chip 14 is thermally connected to the center of the bottom surface of the heat receiving portion 71 via a thermally conductive grease (not shown).

The pump 72 comprises an impeller 73 and a pump housing 74. The impeller 73 is supported on the pump housing 74 via a flat motor 75. A rotating shaft R1 of the impeller 73 stands up along a thickness direction of the first housing 4. The flat motor 75 starts to rotate the impeller 73, for example, when the portable computer 1 is powered on or when the temperature of the semiconductor package 12 reaches a predetermined value.

The pump housing 74 is formed a metal material such as an aluminum alloy which has a high thermal conductivity. The pump housing 74 is shaped like a flat box having a bottom wall 76a, a top wall 76b, and a peripheral wall 76c. The walls 76a, 76b, and 76c of the pump housing 74 constitute a pump chamber 77 into which a liquid coolant is filled. The impeller 73 is accommodated in the pump chamber 77.

The bottom wall 76a of the pump housing 74 is placed on the top surface of the heat receiving portion 71 to thermally connect to the heat receiving portion 71. The top wall 76b of the pump housing 74 has a fitting groove 78. The fitting groove 78 crosses the center of the pump housing 74. The first end 46a of the heat pipe 42 is fitted into the fitting groove 78 in the pump housing 74. Thus, the heat pipe 42 is thermally connected to the pump housing 74.

The pump housing 74 has an inlet port 80 and an output port 81 in its peripheral wall 76c. The inlet port 80 and the outlet port 81 are arranged parallel with each other to extend toward the rear of the first housing 4. Both inlet port 80 and outlet port 81 are connected to the pump chamber 77. The inlet port 80 of the pump 72 is connected to the outlet port 37 of the heat radiating portion 19 via the second pipe 39. The outlet port 81 of the pump 72 is connected to the inlet port 36 of the heat radiating portion 19 via the first pipe 38.

The pump 72, integrated with the heat receiving portion 71, is fixed to the printed circuit board 10. The printed circuit board 10 has four stud pins 82 protruding upward. The stud pins 82 are located outside the semiconductor package 12 on its diagonal lines. Each of the stud pins 82 has a threaded portion 83 at one end of it. The threaded portion 83 penetrates the printed circuit board 10 and is screwed into a reinforcing plate 84 placed on the bottom surface of the printed circuit board 10.

A holding member 85 is fixed to the upper end surfaces of the stud pins 82 via respective screws 86. The holding member 85 is a cross-shaped plate spring having a pressing portion 87 in its center. The pressing portion 87 of the holding member 85 presses the top wall 76b of the pump housing 74 downward. Thus, the pump housing 74 is pressed against the heat receiving portion 71 and is held on the printed circuit board 19. Furthermore, the pressing portion 87 of the holding member 85 presses the first end 46a of the heat pipe 42 against the inner surface of the fitting groove 78. This ensures that the heat pipe 42 and the pump housing 74 are thermally connected together.

With this arrangement, heat from the IC chip 14 is conducted to the bottom wall 76a of the pump housing 74 via the heat receiving portion 71. Since the pump housing 74 has the pump chamber 77 filled with the liquid coolant, the liquid coolant absorbs most of the heat conducted to the pump housing 74.

When the impeller 73 of the pump 72 rotates, the liquid coolant in the pump chamber 77 is delivered to the heat radiating portion 19 via the first pipe 38. Thus, the liquid coolant is forcibly circulated between the pump chamber 77 and the coolant channel 34 in the heat radiating portion 19.

A detailed description will be given. A liquid coolant that has absorbed heat from the IC chip 14 in the pump chamber 77 is delivered to the heat radiating portion 19 through the first pipe 38. The liquid coolant then flows through the coolant channel 34. While the liquid coolant is flowing, the heat from the IC chip 14 absorbed by the liquid coolant conducts to the display housing 8 via the first and second radiator plates 31 and 32. The heat is released from the outer surface of the display housing 8 by natural air cooling.

The liquid coolant is cooled while flowing through the coolant channel 34. It then returns to the pump chamber 77 of the pump 72 through the second pipe 39. The liquid coolant absorbs heat from the IC chip 14 again while flowing through the pump chamber 77. It is then delivered to the heat radiating portion 19. The repetition of such a cycle allows heat from the IC chip 14 to be released to the exterior of the portable computer 1 through the heat radiating portion 19.

In the above third embodiment, the first end 46a of the heat pipe 42 is thermally connected to the pump housing 74. Thus, part of the heat from the IC chip 14 conducted to the pump housing 74 is transferred to the heat sink 41, which is separate from the heat radiating portion 19, through the heat pipe 42. This part is released from the heat sink 41.

Consequently, as in the case with the above first embodiment, the semiconductor package 12 can be efficiently cooled by using both liquid cooling with a liquid coolant and forced air cooling.

The present invention is not limited to the above embodiments. Many changes may be made to these embodiments without departing from the spirit of the invention. For example, the heat generating component is not limited to the semiconductor package as a microprocessor. It may be other circuit component mounted on a printed circuit board.

Furthermore, the electronic apparatus according to the present invention is not limited to a portable computer. For example, it may also be implemented in information terminal equipment such as a PDA (Personal Digital Assistants).

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An electronic apparatus comprising:
   a housing having a heat generating component;
   a pump having a pump housing thermally connected to the heat generating component and an impeller accommodated in the pump housing;
   a heat radiating portion which releases heat from the heat generating component;
   a circulating path through which a liquid coolant circulates between the pump housing and the heat radiating portion, the circulating path being used to transfer the heat from the heat generating component conducted to the pump housing, to the heat radiating portion via the liquid coolant;
   a heat sink which is separate from the heat radiating portion and the circulating path;
   a heat transferring member which transfers part of the heat from the heat generating component conducted to the pump housing, to the heat sink, the heat transferring member having a first end thermally connected to the pump housing and a second end thermally connected to the heat sink; and
   a fan which blows a cooling air against the heat sinks,
   wherein the impeller of the pump is located between the heat generating component and the first end of the heat transferring member.

2. The electronic apparatus according to claim 1, wherein the heat transferring member is a heat pipe, and the heat sink having a plurality of radiating fins on its outer peripheral surface.

3. The electronic apparatus according to claim 1, further comprising a pump which is installed in the circulating path to deliver the liquid coolant and which starts to be driven when the temperature of the heat generating component reaches a predetermined value.

4. The electronic apparatus according to claim 1, further comprising another heat generating component adjacent to said heat generating component, said another heat generating component being accommodated in the housing, the heat receiving portion being thermally connected to both said heat generating component and said another heat generating component.

5. The electronic apparatus according to claim 1, wherein the pump delivers the liquid coolant heated by the heat generating component to the heat radiating portion.

6. The electronic apparatus according to claim 1, wherein the pump, the heat sink, and the fan are accommodated in the housing.

7. The electronic apparatus according to claim 6, wherein the fan is arranged between the pump and the heat sink.

8. The electronic apparatus according to claim 7, wherein the fan includes an impeller and a fan casing which accommodates the impeller, the fan casing having an ejection port through which a cooling air is ejected, and the heat sink is arranged at the ejection port in the fan casing.

9. The electronic apparatus according to claim 1, wherein the impeller has a rotating shaft, and the portion in which the heat generating component and the pump housing are thermally connected and the portion in which the first end of the heat transferring member and the pump housing are thermally connected are located on the rotating shaft, respectively.

10. The electronic apparatus according to claim 1, further comprising:
    a holding member which holds the pump housing in the housing and presses it against the heat generating component.

11. The electronic apparatus according to claim 10, wherein the pump housing has a fitting grove into which the first end of the heat transferring member is fitted.

12. The electronic apparatus according to claim 11, wherein
    the holding member has a pressing portion in its center and the pressing portion thermally connects the heat transferring member and the pump housing by pressing the first end of the heat transferring member into the fitting grove.

13. The electronic apparatus according to claim 1, further comprising:
    a heat receiving portion formed integrally with the pump housing of the pump, the heat generating component being thermally connected to the heat receiving portion.

14. The electronic apparatus according to claim 1, wherein
the pump housing has an inlet port into which the liquid coolant flows and an outlet port from which the liquid coolant is discharged, the inlet port and the outlet port projecting from the pump housing in the same direction in line with each other, and the heat transferring member is guided towards the pump housing from a side opposite to the direction in which the ports are projected.

15. A cooling unit which cools a heat generating component accommodated in an electronic apparatus, the cooling unit comprising:
a pump having a pump housing thermally connected to the heat generating component and an impeller accommodated in the pump housing;
a heat radiating portion which releases heat from the heat generating component;
a circulating path through which a liquid coolant circulates between the pump housing and the heat radiating portion, the circulating path being used to transfer the heat from the heat generating component conducted to the pump housing, to the heat radiating portion via the liquid coolant;
a heat sink which is separate from the heat radiating portion and the circulating path;
a heat transferring member which transfers part of the heat from the heat generating component conducted to the pump housing, to the heat sink, the heat transferring member having a first end thermally connected to the pump housing and a second end thermally connected to the heat sink; and
a fan which blows a cooling air against the heat sink,
wherein the impeller of the pump is located between the heat generating component and the first end of the heat transferring member.

16. The cooling unit according to claim 15, wherein the heat transferring member is a heat pipe, and the heat sink having a plurality of radiating fins on its outer peripheral surface.

17. The cooling unit according to claim 16, wherein the pump delivers the liquid coolant heated by the heat generating component to the heat radiating portion.

18. The cooling unit according to claim 16, further comprising a pump which is installed in the circulating path to deliver the liquid coolant.

19. The cooling unit according to claim 15, wherein
the impeller has a rotating shaft, and the portion in which the heat generating component and the pump housing are thermally connected and the portion in which the first end of the heat transferring member and the pump housing are thermally connected are located on the rotating shaft, respectively.

20. The cooling unit according to claim 15, further comprising:
a heat receiving portion formed integrally with the pump housing of the pump, the heat generating component being thermally connected to the heat receiving portion.

21. The cooling unit according to claim 15, further comprising:
a holding member which presses the pump housing against the heat generating component.

22. The cooling unit according to claim 21, wherein
the pump housing has a fitting grove into which the first end of the heat transferring member is fitted.

23. The cooling unit according to claim 22, wherein
the holding member has a pressing portion in its center, and the pressing portion thermally connects the heat transferring member and the pump housing by pressing the first end of the heat transferring member against the fitting grove.

* * * * *

UNITED STATES PATENT AND TRADEMARK OFFICE
CERTIFICATE OF CORRECTION

PATENT NO. : 6,900,990 B2
DATED : May 31, 2005
INVENTOR(S) : Tomioka

It is certified that error appears in the above-identified patent and that said Letters Patent is hereby corrected as shown below:

Column 10,
Line 7, change "sinks," to -- sink, --.
Lines 15-19, delete the claim in its entirety and substitute therefor:
-- 3. The electronic apparatus according to claim 1, wherein the pump starts to be driven when the temperature of the heat generating component reaches a predetermined value. --.
Line 53, change "grove" to -- groove --.
Line 61, change "grove." to -- groove. --.

Column 12,
Lines 8-10, delete the claim in its entirety.
Line 29, change "grove" to -- groove --.
Line 36, change "grove." to -- groove. --.

Signed and Sealed this

Thirtieth Day of August, 2005

JON W. DUDAS
*Director of the United States Patent and Trademark Office*